US009478501B2

(12) United States Patent
Thallner

(10) Patent No.: US 9,478,501 B2
(45) Date of Patent: Oct. 25, 2016

(54) SUBSTRATE PROCESSING AND ALIGNMENT

(76) Inventor: Erich Thallner, Scharding (AT)

( * ) Notice: Subject to any disclaimer, the term of this patent is extended or adjusted under 35 U.S.C. 154(b) by 156 days.

(21) Appl. No.: 11/715,525

(22) Filed: Mar. 7, 2007

(65) Prior Publication Data

US 2007/0210460 A1    Sep. 13, 2007

Related U.S. Application Data

(60) Provisional application No. 60/780,574, filed on Mar. 8, 2006.

(51) Int. Cl.
| | | |
|---|---|---|
| *H01L 23/544* | (2006.01) | |
| *B82Y 10/00* | (2011.01) | |
| *B82Y 40/00* | (2011.01) | |
| *G03F 7/00* | (2006.01) | |
| *G03F 9/00* | (2006.01) | |

(52) U.S. Cl.
CPC ............. *H01L 23/544* (2013.01); *B82Y 10/00* (2013.01); *B82Y 40/00* (2013.01); *G03F 7/0002* (2013.01); *G03F 9/7046* (2013.01); *G03F 9/7076* (2013.01); *G03F 9/7088* (2013.01); *H01L 2223/54453* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 4,861,162 A | | 8/1989 | Ina |
| 5,418,363 A | * | 5/1995 | Elings et al. ................. 250/306 |
| 5,865,978 A | * | 2/1999 | Cohen ........................... 205/118 |
| 6,208,407 B1 | | 3/2001 | Loopstra |
| 2001/0055117 A1 | * | 12/2001 | Mizutani ....................... 356/401 |
| 2002/0127865 A1 | | 9/2002 | Maltabes et al. |
| 2003/0003676 A1 | * | 1/2003 | Lee et al. ...................... 438/401 |
| 2005/0224452 A1 | * | 10/2005 | Spiess et al. ................... 216/41 |

FOREIGN PATENT DOCUMENTS

| | | |
|---|---|---|
| EP | 1617293 A1 | 1/2006 |
| JP | 02069958 A1 | 8/1990 |
| JP | 2001-332490 A | 11/2001 |
| JP | 2004319891 A | 11/2004 |
| JP | 2005-512304 A | 4/2005 |
| JP | 2005167166 A | 6/2005 |
| JP | 2005-215508 A | 8/2005 |
| JP | 2005317653 A1 | 10/2005 |
| JP | 2007300072 A | 11/2007 |
| JP | 2014090180 A | 5/2014 |

OTHER PUBLICATIONS

Tomoya Matsuoka, Japanese Patent Office Action, Patent Application No. 2014-205004, Jul. 9, 2015, mailed Jul. 14, 2015.

* cited by examiner

*Primary Examiner* — Jeremiah Smith
(74) *Attorney, Agent, or Firm* — William C. Milks, III

(57) ABSTRACT

A substrate can efficiently be manufactured by separating the alignment and the actual processing when an alignment mark is provided, which is fixed with respect to the substrate and when position information on a position of a process area on the substrate is retrieved with respect to the alignment mark before the substrate is processed. During the processing alignment can then be performed by redetermining the position of the alignment mark only once and by using the stored position information on the position of the process area.

20 Claims, 8 Drawing Sheets

SUBSTRATE PROCESSING AND ALIGNMENT

CROSS-REFERENCE TO RELATED APPLICATION

This application claims priority from U.S. Provisional Patent Application No. 60/780,574, which was filed on Mar. 8, 2006, and is incorporated herein by reference in its entirety.

TECHNICAL FIELD

The present invention relates to the processing of substrates and in particular to a concept for precise and efficient alignment of substrates with respect to processing units.

BACKGROUND

Continuing progress in the semiconductor industry is leading to ever-smaller structures that have to be processed on the surface of a substrate, such as a silicon wafer. Presently, structures that are to be processed on the surface of a wafer are transferred to the wafer by photolithographic methods, i.e. by projecting the structures through a mask on the wafer surface. This is normally done using ultra-violet light that allows, due to its short wave length, the generation of small structures and can at the same time be used to activate material, such as photo resistive coatings of the wafer. The desire to further decrease size of the semiconductor structures thus leads to the problem of projecting structures of the size of hundreds of nanometers or possibly even of tens of nanometers to the wafer surface. The transfer of the desired structure from the mask to the surface of the wafer was continuously developed and an on-going decrease of structure size was accomplished in the past using different physical effects, such as decreasing the structure size using media of high refraction index in between the mask and the wafer. Nonetheless, the limit of the optical transfer processes seems to be nearly reached.

Several different approaches to further decrease the structure size in the future are discussed. Particularly attractive are so-called nano-imprinting techniques that achieve the application of the structures on the waver surface by a printing technique, comparable to a normal stamp. On the one hand, stamps of solid material, typically of metal such as nickel, can be applied to mechanically imprint a structure on the surface. On the other hand, one may use stamps of soft materials, such as PDMS (Polydimethylsiloxan), that can transfer Thiole to the surface of the wafer, which may prevent the surface from chemical etching. Using nano-imprinting techniques, structure sizes can easily go down to the nanometer scale, i.e. transistors with gate lengths in the 10 nm-regime become feasible.

Typically, the production of a semiconductor device comprises several consecutive steps of different processes, such as edging or photolithography, wherein each of the steps has to be precisely aligned with the preceding step to produce a functional semiconductor device. It may be noted that also the production of microscopic mechanical elements on substrates is a field of high commercial interest and shares the same demands on high alignment precision of consecutive production steps. It is evident that a transition to future structures, for example, by nano-imprinting, will further increase the accuracy demands of the alignment processes.

During the processing of a semiconductor device alignment of the semiconductor with respect to processing devices is normally required several times during the production. This is typically done using marks which are imprinted on the surface of the wafer A typical computer processor has only an active area of several hundreds of $mm^2$, whereas a waver may be as big as 30 cm in diameter. That is only a small fraction of the wafer size is processed in a single photolithographic step and thus the complete wafer is processed by a sequence of consecutive photolithographic steps across the wafer surface. Once the complete wafer surface is processed, one proceeds to a next production step, transferring more structures on the wafer. That is, each wafer segment or process area (corresponding to the size of a single photolithographic step) has to be aligned with the processing unit in the next step of the process for guaranteeing a fully functional device.

This is normally done by marks surrounding the individual process areas and that allow for an adjustment of the process unit with respect to the process area before processing the wafer. Normally, the marks are detected and adjusted by optical methods that provide sufficient accuracy for the optical processing techniques currently available. For further proceeding technology, i.e. decreasing the structure sizes into the nanometer regime, the precision of these alignment procedures is insufficient.

One further problem of the marks surrounding the process areas is that these marks have to be transferred or refreshed after each single production step, since the marks themselves may be erased or falsified by certain process steps, such as sputtering or edging. Therefore, the marks themselves have to be transferred to each consecutive production step, which may yield accumulating errors during the production, decreasing the efficiency of correctly manufactured semiconductor devices on the wafer. Apart from these principle problems of the prior art, there are also technical problems, such as the space that is required for the prior art optical alignment systems. When using nano-imprinting methods for the production the very first production step can principally be performed without alignment. However, when it comes to consecutive production steps, alignment is still required even with higher accuracy, when using the nano-imprinting technique with its structure sizes in the nm-regime.

The space-problems (related to the space required for alignment systems close to the process units) tend to increase when going to nanometer-scales, since then, systems that are able to adjust on a nanometer scale are rather big (compared to the size of the device that has to be structured). In the case of nano-imprinting, an alignment system operating on a nanometer scale that is incorporated into the processing unit (stamp) is presently not feasible. An atomic force microscope is a high precision measurement tool, that is probing the surface of a material by a mechanical probe which has a tip of the size of essentially one atomic diameter (in the order of $10^{-10}$ nm). Although the tip itself and the needle having this tip, is normally rather small, the read-out is performed with an optical laser system that detects the tip movement by a change of the position of a reflected laser spot on an imaging device. To detect movements of several nanometers, the dimensions of the read-out system have to be rather big, thus making it infeasible to incorporate them into the process unit that stamps the surface of a wafer.

One further big disadvantage of the prior art method is that the alignment (adjustment) of the process unit with respect to the wafer and the processing itself is done in a sequential manner, i.e. one alignment step is preceding each processing step, which is putting limits to the overall efficiency of a production process using prior art alignment.

This is especially true. when either the processing or the adjustment is consuming much more time than its counterpart, which means that in the view of overall processing time for a single wafer, a lot of time is wasted awaiting the end of one particular process step.

SUMMARY

According to an embodiment, a method for manufacturing a device using a substrate may have the steps of: determining a position of an alignment mark being fixed with respect to the substrate; determining position information on the position of a first process area and on the position of a second process area with respect to the alignment mark using topographic information determined within the process areas of the surface of the substrate; redetermining the position of the alignment mark; aligning the position of the first process area using information derived from the redetermined position of the alignment mark and from the position information on the position of the first process area; processing the first process area using a nano-imprinting technique; aligning the second process area using information derived from the position information on the position of the second process area; and processing the second process area using the nano-imprinting technique.

According to another embodiment, a substrate support structure adapted to allow determination of position information on a position of a process area on the surface of a substrate may have: a substrate support having an alignment mark having a surface structure, the surface structure having topographic information; a substrate, being reversibly fixed to the substrate support, such that the substrate is in fixed orientation with respect to the alignment mark; and a computer-readable information structure, allowing to carry information associated to the substrate.

According to another embodiment, an apparatus for processing a substrate may have: a calibration unit for determining the position of the alignment mark; a position measuring unit for determining topographic information of the surface of the substrate and for deriving the position information on the position of a first process area and on the position of a second process area using information on the determined position of the alignment mark and the topographic information determined within the process areas; a processing device for processing the first and the second process areas using nano-imprinting-techniques; a recalibration unit for redetermining the position of the alignment mark; and an alignment unit for performing an alignment of the processing device and the first process area using information derived from the redetermined position of the alignment mark and from the position information on the position of the first process area and for performing an alignment of the processing device with the second process area using information derived from the position information on the position of the second process area.

The present invention is based on the finding that a substrate can efficiently be manufactured separating the alignment and the actual processing, when an alignment mark is provided, which is fixed with respect to the substrate and when position information on a position of a process area on the substrate is retrieved with respect to the alignment mark before the substrate is actually processed. During the processing, alignment can then be performed by redetermining the position of the alignment mark and by using the stored position information.

In one embodiment of the present invention a substrate, that is to be processed, is provided together with an associated alignment mark, which is fixed with respect to the substrate. Additionally, position information on the position of process areas on the substrate is provided together with the substrate, wherein the position information is given with respect to the alignment mark (for example a two-dimensional alignment mark, that defines a coordinate system on the surface of the substrate). In other words, a substrate, that has been completely mapped, i.e. the position information of the process areas of the substrate with respect to the alignment mark is provided for a subsequent manufacturing step. The position of the one or more alignment marks on the substrate may be according to the specific implementation requirements. One choice may be to place the marks close to the border of a wafer where normally some unused space remains due to the usually rectangular geometry of devices manufactured on the substrate and the circular geometry of the wafer itself.

Therefore, during the actual processing, only a single measuring step is to be performed. Specifically, the position of the alignment mark has to be redetermined, when the substrate is inserted into the processing unit. Knowing the position of the alignment mark and having the stored position information on the process areas, the single process areas can be aligned with a process unit with high accuracy, which can for example be performed by a state of the art air-cushioned process table.

In another embodiment of the present invention, the substrate is mounted to a substrate support which that has incorporated the alignment mark. The connection between the substrate and the substrate support is such that the substrate can be removed from the substrate support without damage, such that a substrate may be used independently from the substrate support after a given production step. Using such a substrate support has the great advantage, that the substrate can be stabilized against mechanical distortions. Furthermore, the substrate can be aligned and then stored together with the substrate support, wherein the alignment (the information of the position of the process areas with respect to the alignment mark) are persistent in time. Hence, the substrate and the substrate support may even be stored or transported to another place, without using the alignment information.

It is a great advantage that the measuring (aligning) of the substrate can be separated from the processing itself, yielding a much higher overall process performance. This is of particular interest when either the processing or the aligning takes much more time than the corresponding step. Applying prior art techniques would then result in a waste of time since the sequential prior art approach would lead to unwanted wait cycles either during the processing or during the alignment.

In a further embodiment of the present invention, the alignment information is stored in a memory associated to the aligned substrate. Transferring the stored information together with the substrate is enabling a production process where the alignment is separated from the processing. In a further embodiment of the present invention, the substrate support comprises a memory device that holds the calibration information for the substrate attached to the particular substrate support.

In a further embodiment, the substrate support is having an identification mark, which is preferably machine-readable (for example a bar-code) and which is stored together with the alignment information (for example in a data base) to allow for a later association of stored alignment data with a particular substrate.

In a further embodiment of the present invention, the alignment mark is built by a nano-structured surface on either the substrate or the substrate support such that the detection of the alignment mark can be performed with an accuracy better than 10 nanometers, for example by an atomic force microscope (AFM). To this end the alignment mark has topographic information comprising surface structures with structure sizes smaller than preferably 100 nm. In a further preferred embodiment, the structure sizes are smaller than 20 nm.

In a further embodiment of the present invention, the inventive concept is incorporated into a process unit which is used to process a substrate using nano-imprinting techniques and provides the alignment accuracy making high-precision nano-imprinting possible.

In a further embodiment of the present invention, the position information is received and stored as topographic information, i.e. a three-dimensional surface image of the surface of a substrate is produced within a coordinate system that is related to the position of the alignment mark. Using a topographic information rather than individual alignment marks has the great advantage that even a miss-aligned first production step would not yield a broken device, since the position information for the following production step is retrieved from the topographic information produced by the previous (possibly misaligned) production step.

BRIEF DESCRIPTION OF THE DRAWINGS

Preferred embodiments of the present invention are subsequently described by referring to the enclosed drawings, wherein.

DETAILED DESCRIPTION

Figure 1:
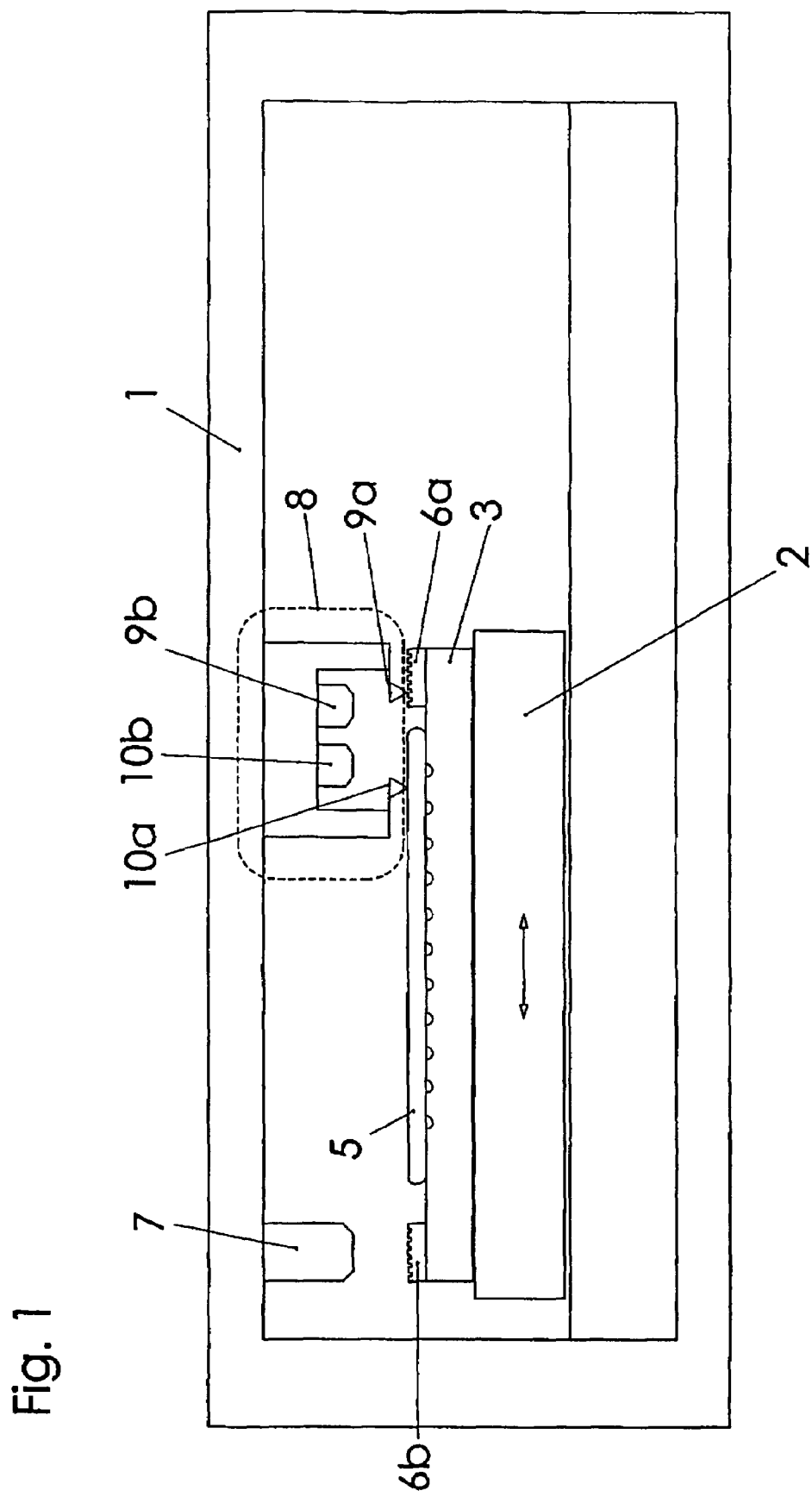
FIG. 1 shows an example of an inventive apparatus for providing position information on a surface of a substrate.

FIG. 1 shows an example of an inventive apparatus for providing position information on the position of process areas on the surface of a substrate. FIG. 1 shows a two-dimensional act of the apparatus in the direction perpendicular to the surface of the substrate. An enclosure 1 defines an enclosed process volume, which may be temperature stabilized and decoupled from the environment for allowing a precise measurement. Shown are furthermore an air-cushioned table 2, a substrate support 3, a substrate 5, a first alignment mark 6a, a second alignment mark 6b, a calibration unit 7, and a position-measuring unit 8. The substrate 5 is attached to the substrate support 3 in a reversible way, that is by means of a fixation that can be removed without damaging the substrate 5. As indicated in FIG. 1, this may for example be performed by using partly evacuated structures underneath the substrate 5 pulling the substrate to the surface of the substrate support 3. Alternatively, other ways to temporarily fix the substrate to the substrate support, which is also called temporary bonding, are of course also suited to implement the inventive concept. This can for example be achieved by "gluing" the parts together using melted wax, or by using special adhesive foils.

The substrate support 3 further comprises first and second alignment marks 6a and 6b, which are in a fixed position relative to the substrate 5. The substrate support 3 is mounted to the air-cushioned table 2, which can be moved with high precision (nanometer scale). The position-measuring unit comprises a calibration sensor 9a, an auxiliary calibration sensor 9b, a position sensor 10a, and an auxiliary position sensor 10b.

As already mentioned, the substrate 5 is fixed with respect to the first and second alignment mark 6a and 6b. To reproducibly map the surface of the substrate 5 in a fixed coordinate system, the coordinate system shall be defined by the first and the second alignment mark 6a and 6b. Therefore, the position of the alignment mark with respect to the substrate 5 has to be determined unambiguously. To achieve this, alignment mark 6a is measured by the calibration sensor 9a. In the shown example, the alignment mark 6a comprises a nano-structured surface that is probed with an atomic force microscope (the calibration sensor 9a). The calibration mark 6a is adapted to provide the position information in one dimension. Relative position measurement is possible by counting the number of bumps the atomic force microscope (calibration sensor 9a) is passing while the air-cushioned table 2 is moving. An absolute position information could then be gathered straight forwardly by counting the number of bumps from the beginning of the measurement. Alternatively the absolute position could be coded within the calibration mark 6a by varying the shape of the individual bumps or for example by having bumps of different lengths within the direction of the movement. The detection of the position of the alignment mark by probing a specific topographic structure of the surface is just one possibility. Alternative methods of measuring absolute or relative positions or distances are equivalently suited to implement the inventive concept.

To define a complete coordinate system on the surface of the substrate support 3, a second alignment mark 6b may be present on the substrate support 3, which can be detected either by a further atomic force microscope or for example by a calibration unit 7 that incorporates optical read-out, as indicated in FIG. 1. As indicated by the auxiliary calibration sensor 9b, the position of the first alignment mark 6a may also be alternatively determined by an optical read-out system. Once the alignment marks are detected and hence the coordinate system on the substrate support 3 is established, the surface of the substrate 5 can be measured by a scanning technique with respect to the established coordinate system. Having a high precision air-cushioned table 2, the scanning could for example be done by a controlled movement of table No. 2. During the stepwise movement, the position sensor 10a is able to measure the position information of the substrate 5 with high precision in the a coordinate system defined with nanometer precision and therefore allows for a later precise reproduction of the properties of the substrate.

The position information measured with the inventive apparatus could for example be the position of previously applied topographic information on the surface of the substrate 5, such as imprinted marks. The advantage is obviously that once the coordinate system on the wafer support is known and the position information is recorded in the so defined coordinate system, a processing of the wafer surface or of distinct areas of the wafer surface can be performed without individually aligning the surface areas of the wafer. On the contrary, a single determination of the position of the alignment marks 6a and 6b is enough to address every single process area on the surface of the substrate 5 (wafer).

It is one big advantage of the inventive concept that the high-precision alignment (measuring of surface criteria of the substrate 5) can be separated from processing. If either the alignment or the processing consumes much more time, this separation can yield a high gain in overall process performance. For example, a single apparatus for providing position information according to FIG. 1 may be used to align the substrates for a number of processing units.

Although, the inventive apparatus of FIG. 1 may be used to determine the position of special marks that are imprinted on the surface of the substrate for alignment reasons, it is a preferred embodiment of the present invention that the position information determined is topographic information of structures previously applied to the surface of the substrate.

This has the great advantage that even in the case where a preceding processing step or even the very first processing step produced a structure on the surface of the substrate that is deviating from its design-position, a measurement of the topography of the substrate 5 will allow for a precise alignment. Such, the following processing can take place at a position yielding a fully functional device. In the prior art technique, where every processing step is aligned with imprinted alignment marks on the surface of the substrate a small misalignment of a single step of the production would lead to an unusable device and would therefore decrease the overall production efficiency.

The inventive concept provides a possibility to align structures without having to introduce special marks on the surface of a substrate. This further avoids problems with the marks themselves, which might be rendered unusable by certain processes, such as coating the whole wafer with insulating layers, which might potentially also cover the alignment marks or decrease the precision with which the alignment marks can be found by prior art optical alignment systems.

Having the fragile substrate 5 on a substrate support 3 has the additional obvious advantage that the substrate 5 can be transported without the danger of destroying the substrate 5 during the transport. Furthermore, if the topographic data is stored in a memory, which is associated to the substrate 5, the substrate support 3 can, together with the mounted substrate 5, be stored in a storage space prior to the use of the substrate 5. Then a possibility must be provided to unambiguously identify the system of substrate 5 and substrate support 3. Therefore, there may be additional computer-readable marks applied to the substrate support 3, such as for example bar-codes or RFID-tokens, whose reading can be stored together with the topographic or position information in a data base. After storage, the position information can then easily be retrieved by a processing station that reads the computer-readable token and may then read the appropriate position information from a data storage.

In a further embodiment of the present invention some memory device is incorporated into the substrate support 3 such that the position information measured can be directly stored in the substrate support used to transport and store the substrate 5.

Figure 2:
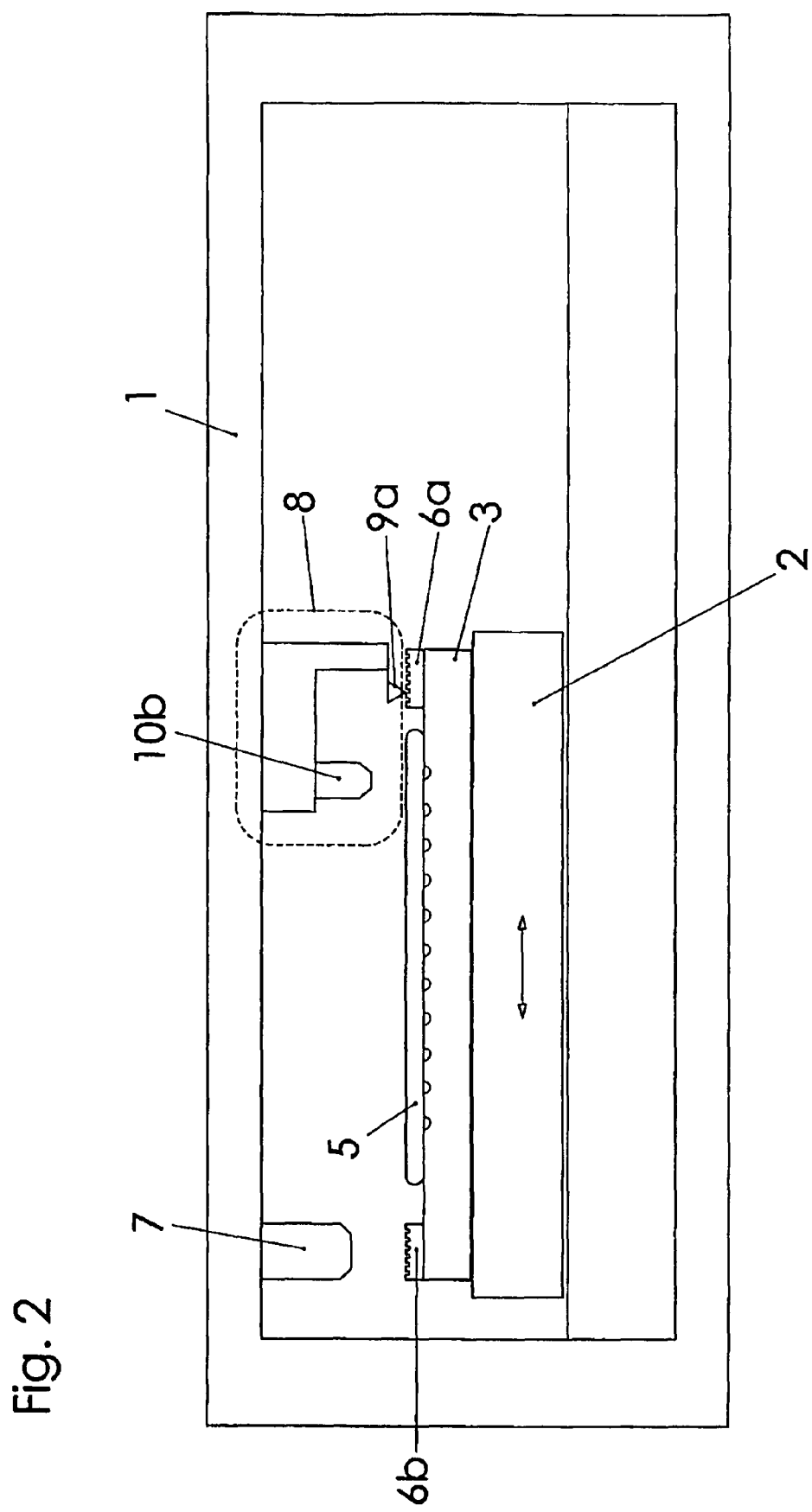
FIG. 2 shows a further embodiment of an inventive apparatus for providing position information.

FIG. 2 shows a further embodiment of the present invention incorporating a different position-measuring unit 8, which may also serve as an example to retrieve the position information as suggested by the inventive concept.

The embodiment shown in FIG. 2 is based on FIG. 1 and therefore the identical parts are labeled with the same numbers and the description of those parts is identically exchangeable within the description of the two figures.

FIG. 2 differs from FIG. 1 in that the position-measuring unit is having an atomic force microscope as calibration sensor 9a and an optical read-out system 10b such as a convocal microscope as a position sensor to measure the surface of the substrate 5. Apart from the embodiment shown in FIG. 2, every different sensor combination is also suited to implement the inventive concept of providing position information on a surface of a substrate.

Figure 3:
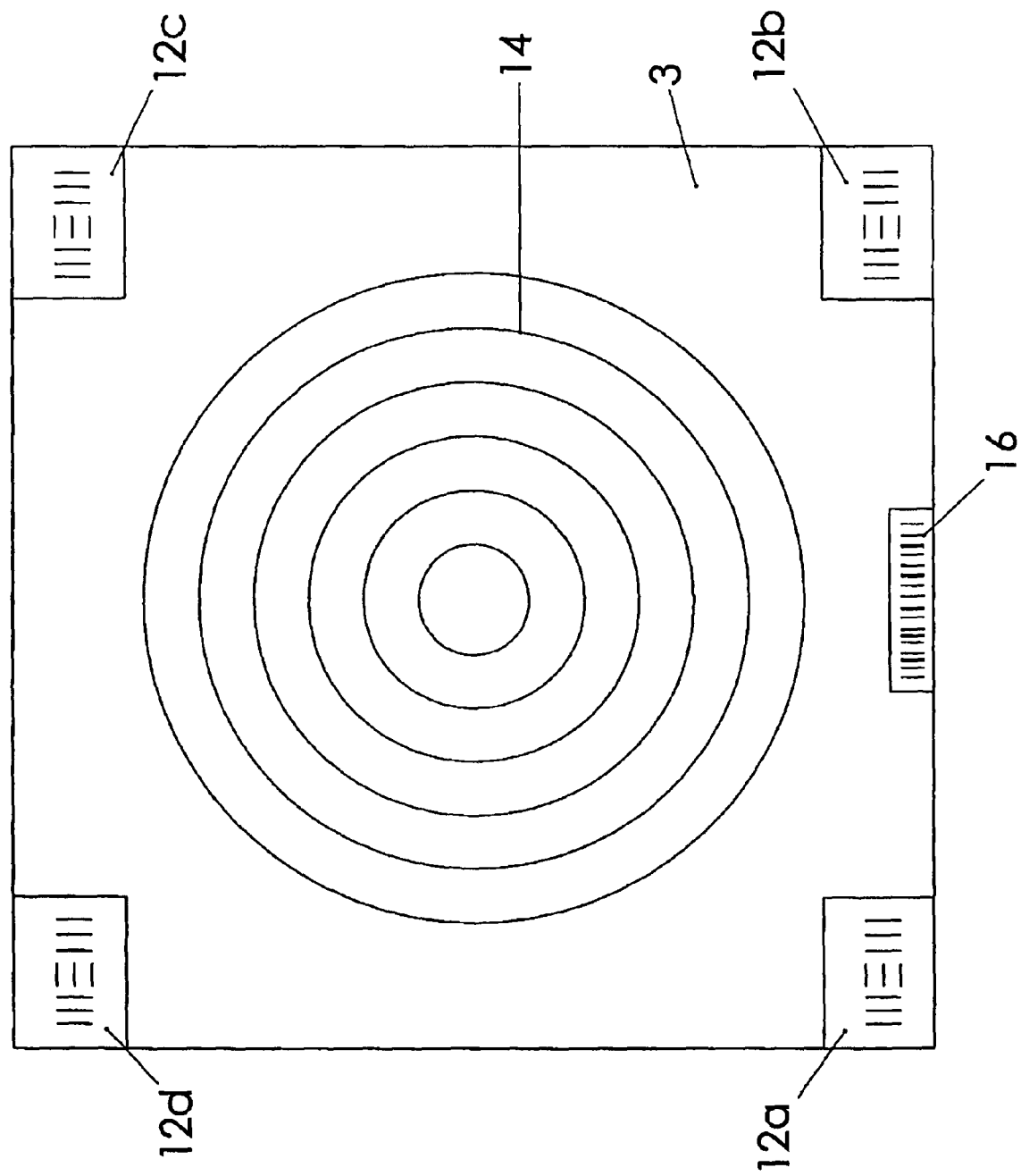
FIG. 3 shows an example for an inventive substrate support structure.

FIG. 3 shows a face on view of an example of an inventive substrate support 3.

The substrate support 3 comprises several alignment marks 12a to 12d and concentric vacuum structures 14 that may be used to fix the substrate 5 on the wafer support 3. The alignment marks 12a to 12d are shown schematically only. They may for example be implemented as optical patterns or as nano-structured surfaces. When an atomic force microscope is used to calibrate the position of the substrate support 3, it is also possible that the inherent surface properties of the substrate support 3 are used for the calibration without the need of applying specific calibration marks. This is possible since an atomic force microscope may probe the surface of a substrate support 3 on an atomic scale and therefore the inherent "finger print" of a specific surface area of the substrate support 3 may also be used as reference mark to calibrate the position of the substrate support 3.

The use of an inventive substrate support 3 has a number of major advantages. Evidently, a wafer and in particular a thinned wafer is protected from damage by being transported, stored, or processed when mounted to a substrate support 3. Since the substrate support 3 defines the coordinate system in which topographic or position information of the wafer surface is recorded and stored, a wafer or substrate 3 can advantageously be aligned and stored in a protected manner for later use. To allow for storage and later use of an already aligned substrate 5, the substrate support 3 may also comprise an identification tag 16 that allows unambiguous identification of the specific substrate support and the wafer or substrate 5 mounted to it. As an example, the identification tag 16 is implemented to be a bar code. Alternatively, every other method of uniquely identifying the device is also possible, such as RFID-units or optical patterns. In a further preferred embodiment of the present invention the substrate support 3 further comprises a memory area in which the calibration data, i.e. the position information on the surface of the substrate 5 can be stored. This has the advantage that a database, associating specific substrates with measured information is made unnecessary, simplifying the overall handling of pre-calibrated substrates 5 and substrate supports 3.

When using a vacuum system as indicated by the vacuum structures 14 to fix the substrate 5 on the substrate support 3, additional structures may be incorporated into the substrate support 3 to keep the vacuum during transport or during storage. This may for example be a vacuum tank or a small vacuum pump that may be energized by an accumulator battery.

The number of alignment marks placed on the surface of the substrate support 3 is variable, a typical choice could be to place them at the four corners of the substrate support, such as shown in FIG. 3. Principally, a single alignment mark having a two-dimensional pattern that can be unambiguously identified is enough to define a coordinate system, in which the topographic information or the position information of the surface of the substrate 3 can be measured.

Figure 4:
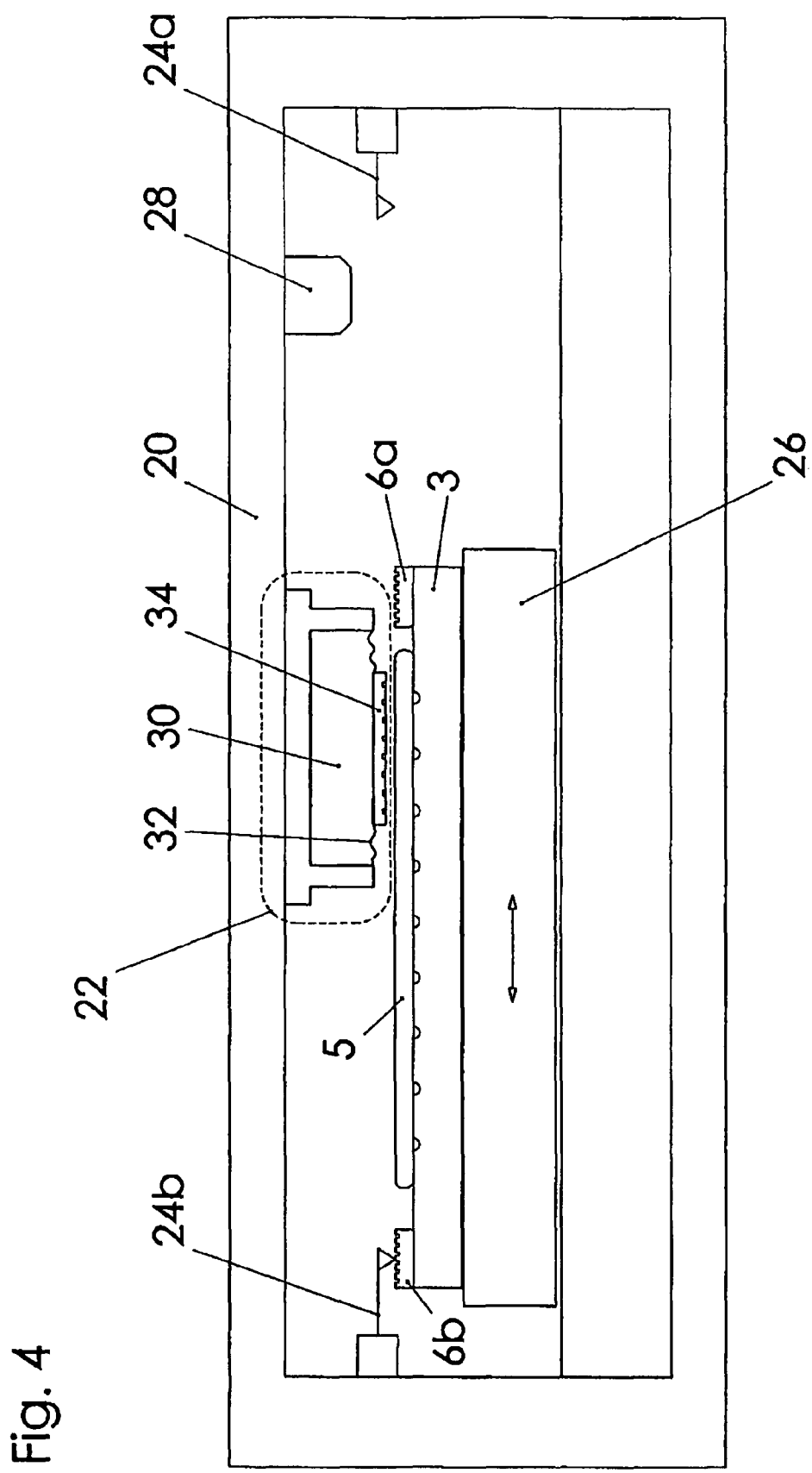
FIG. 4 shows an example of an inventive apparatus for processing a substrate.

FIG. 4 shows an example of an inventive apparatus for processing a substrate. The substrate 5 to be processed is mounted on the substrate support 3 and is already calibrated (aligned), i.e. position information on the surface of the substrate 5 is available during the processing. FIG. 4 shows a housing 20 in which the active components are placed and which may be used as a vacuum chamber to have the processes in a vacuum.

FIG. 4 is further showing a process unit 22, calibration sensors 24a and 24b, an air-cushioned table 26, and an ID-reader 28. The ID-reader 28 may for example be an optical read-out system to identify the substrate support 3 by an imprinted bar code on the surface of the substrate support 3. The calibration sensors 24a and 24b are fixed with respect to the process unit 22 and are used to determine the position of the alignment marks 6a and 6b of the substrate support 3. Once the alignment marks are detected by the calibration sensors 24a and 24b, the coordinate system in which the position information or the topographic information on the surface of the substrate 5 is available, is defined. Thus, the substrate 5 can be aligned to the unit 22 with a precision in the nanometer regime, since the coordinate system is known with nanometer precision and a movement of the air-cushioned table 26 with the same precision is possible.

In the example shown, the process unit 22 comprises a vacuum volume 30, a metallic membrane 32, and a stamp unit 34. The nano-structured stamp unit 34 is adapted to print structures onto a specific process area of the surface of the substrate 5. To do the printing, a small increase of pressure is applied within the vacuum chamber 30 such that the stamp unit 34 moves down towards the surface of the substrate 5.

Using the inventive concept, it is advantageously possible to subsequently process a complete substrate surface with only having one alignment or calibration step performed using the calibration sensors 24a and 24b. Furthermore, as the process unit covers an area of the substrate 5 that is much bigger than the actual processed area given by the stamp unit 34, only the use of the inventive concept enables a production using a process unit 22 as sketched without wasting a lot of surface are of the substrate 5. This is possible according to the present invention since the structures used for the alignment are placed outside the area of the actual substrate, in contrast to prior art techniques that rely on special marks imprinted on the substrate itself.

Figure 5:
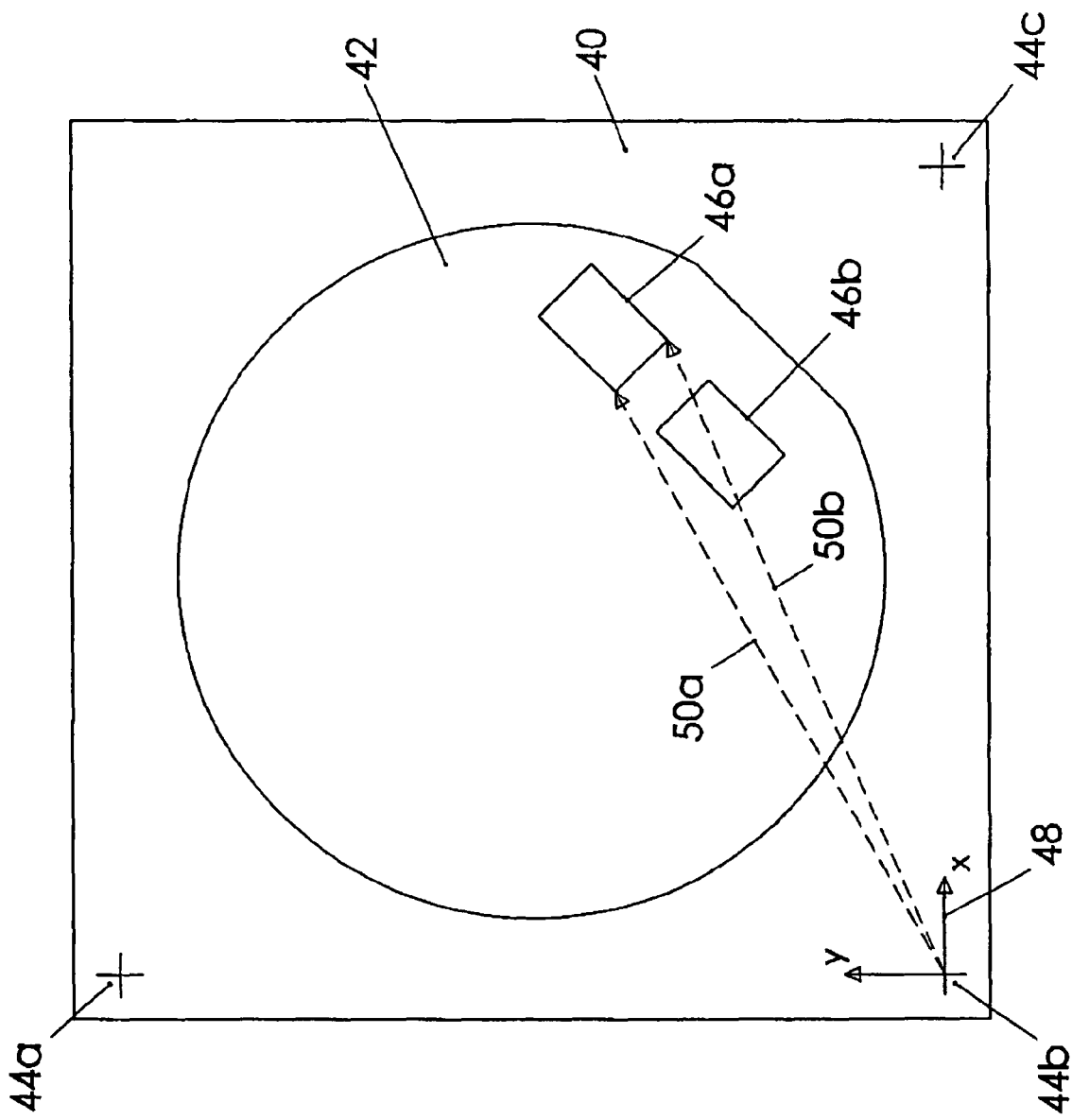
FIG. 5 shows an example for providing position information with respect to an alignment mark.
Figure 6:
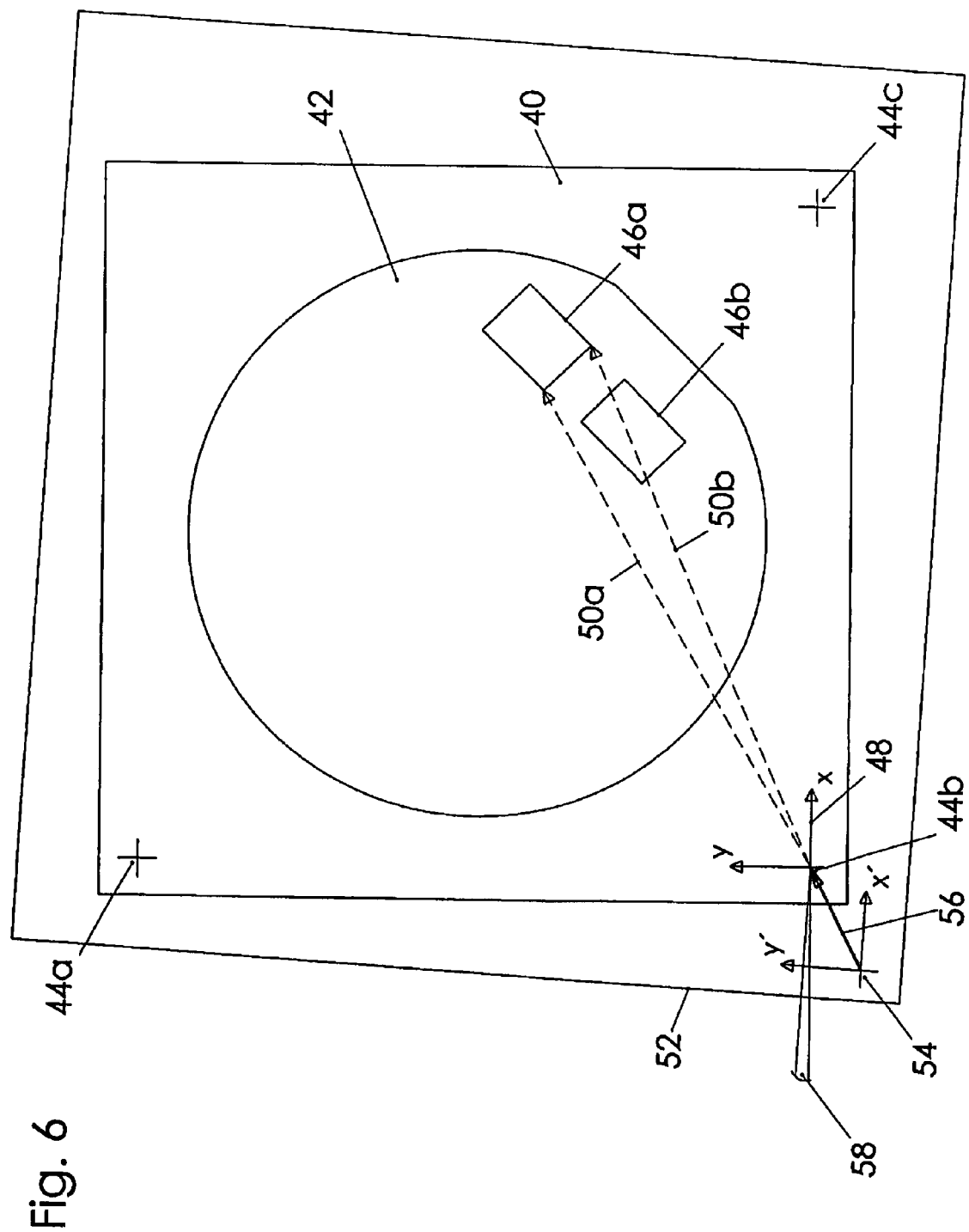
FIG. 6 shows an example of using provided position information.

FIGS. 5 and 6 illustrate, how the position information may be determined by the inventive concept and how the determined position information may later on be used during the processing in a highly efficient manner.

FIG. 5 shows a simplified scetch of a substrate support 40 with a wafer 42 mounted to the substrate support 40. In the shown example, the substrate support 40 comprises three alignment marks 44a to 44c illustrated in a simplified manner. The surface of the wafer 42 has a first process area 46a and a second process area 46b, whose positions shall be measured and stored for later processing. When the position of the alignment marks are determined, a right-handed coordinate system 48 is defined, in which the position information on the position of the first and the second process areas 46a and 46b shall be derived. This can, for example, be achieved by taking a topographic image of the surface of the complete wafer 42 and identifying previously applied structures within the process areas 46a and 46b by image processing techniques. Since the topographic information is scanned within the coordinate system 48, vectors 50a and 50b pointing for example to two edges of the process area 46a can easily be derived. In this example, the position information on the position of the process areas is stored as two-dimensional vectors in the coordinate system 48.

FIG. 6 shows the situation in an apparatus for manufacturing a device using the substrate 42 mounted on the substrate support 40. The position information provided for the manufacturing is the position vectors 50a and 50b, describing the position of the first process area 46a in the coordinate system 48 of the substrate support 40. The substrate support 40 is mechanically introduced into a process volume 52 having the process coordinate system 54, which may be used to calculate the movement of an air-cushioned table 26.

Hence the problem of alignment consists of the determination of the position information on the position of the first process area 46a in the process coordinate system 54. When determining the position of the alignment marks 44a to 44c, the coordinate system 48 of the substrate support 40 can be redetermined within the process coordinate system 54. The relative orientation of the coordinate system 48 with respect to the process coordinate system 54 can be characterized by one translation vector 56 and one rotation angle 58. Having the translation vector 56 and the rotation angle 58 determined (alignment), the position vectors 50a and 50b can easily be transformed into the process coordinate system 54. For determining the position of the first process area 46a in the process coordinate system 54, the determination of the alignment marks 44a to 44c and the knowledge of the position vectors 50a and 50b are required. Once the position of the alignment marks has been determined for the alignment of the first process area 46a, only the stored position information on the further process areas (such as the second process area 46b) is required to align those further to areas.

It may be noted that only two process areas are shown in FIGS. 6a and 6b to simplify the drawing. However, in real implementations the wafer surface is packed with process areas as dense as possible to allow for the cheapest possible production of the single device. The inventive concept is of course applicable for any number of process areas on a substrate.

Figure 7:
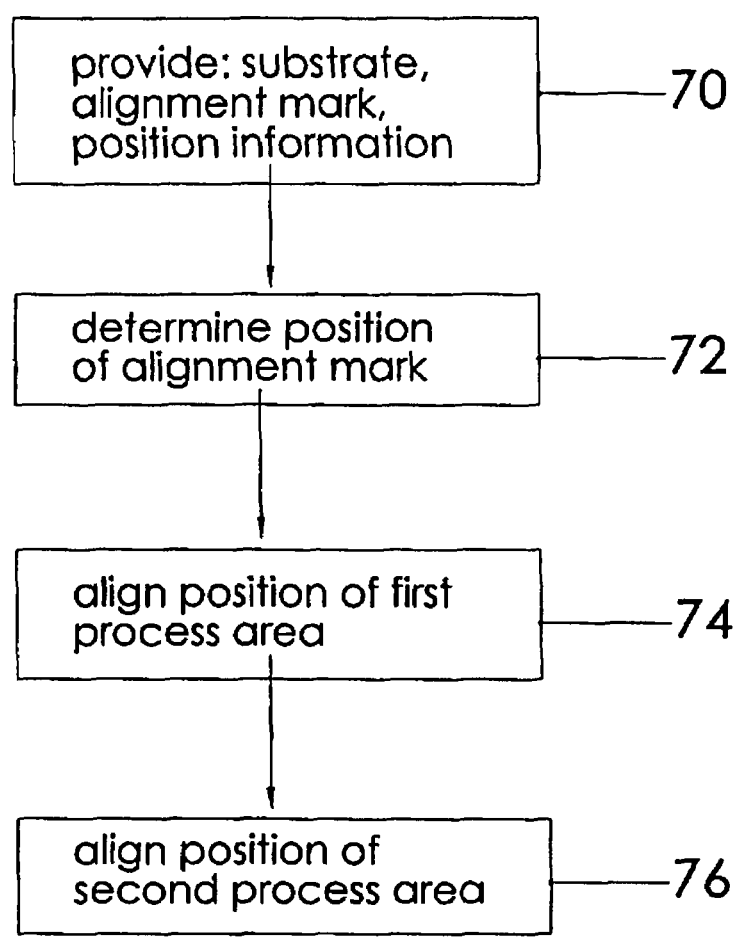
FIG. 7 shows an example for an inventive method for manufacturing a device.

FIG. 7 illustrates an inventive method for manufacturing a device by means of a flow-chart.

In a first providing step 70 a substrate, an associated alignment mark, which is fixed with respect to the substrate and position information on a position of a first and a second process area on a surface of the substrate is provided.

In a coordinate determination step 72, the position of the alignment mark is determined.

Then, the position of the first process area is aligned in a first alignment step 74, using information derived from the determined position of the alignment mark and from the position information on the position of the first process area provided.

Finally, in a second alignment step 76, the position of the second process area is aligned, using (information derived from the position information on the position of the second process area provided.

Figure 8:
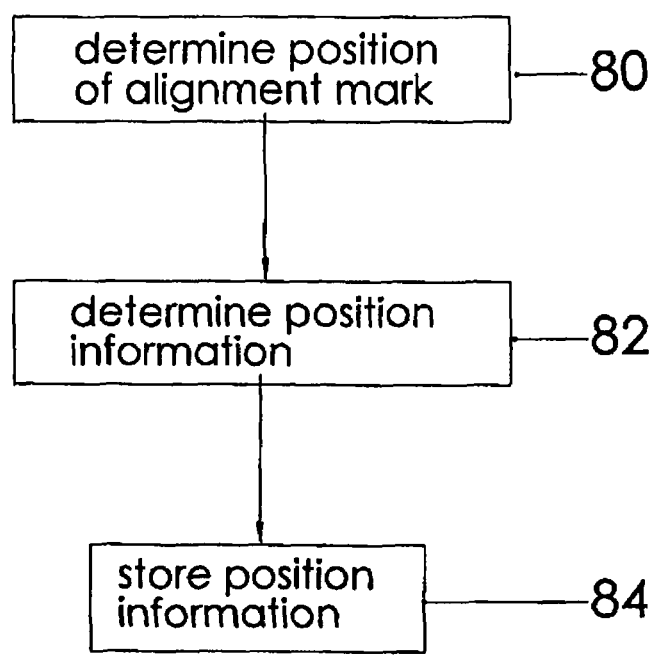
FIG. 8 shows an example for an inventive method for providing position information.

FIG. 8 illustrates an inventive method for providing position information on a position of a first process area and on a position of a second process area on a surface of a substrate using an alignment mark, which is fixed with respect to the substrate.

In a first coordinate determination step 80, the position of the alignment mark is determined.

In a consecutive alignment step 82 position information on the position of the first process area and on the position of the second process area is determined using the position of the alignment mark.

In a storing step 84, the position information on the position of the first and on the position of the second process area is stored in association with the substrate processed.

Summarizing, the present invention suggests a substrate support, which is introduced into an apparatus for providing position information, where it may be fixed to a table that can be adjusted in the x and the y-coordinate and which can furthermore be rotated by an angle Φ. The fixing is typically performed in vacuum. On top of the adjustable table typically a measurement unit is placed, which can detect topographic information on the surface of a wafer and in particular of structures applied to this surface by different methods. Examples of methods for determining this information are confocal microscopy or raster techniques using atomic force microscopes or atomic force needles. The so determined topographic information (height coordinate), which are determined over the full area of the table are stored together with the horizontal coordinates in a storage location, such as a computer. The information can later be read-out by a separate apparatus for processing a substrate. Since the measurement of the structures and the actual processing may consume different amounts of time, it is thus advantageously possible to optimize the overall process performance (time) by combining an appropriate number of measurement and process units. The determination of the position information may generally be achieved by any suitable method known. This could for example also be a measurement of 2 dimensional information, such as taking high resolution images of the surface with optical imaging systems, for example using thinned fibers.

Thus, the separation of measurement and processing increases the overall process throughput. After the measurement of a structured wafer, the wafer is submitted together with the wafer support to a process unit.

A process unit consists of a table that can be adjusted in x, y, and φ. The wafer support (wafer transport tool WTT) is fixed to that table, wherein the fixation may be performed by evacuating a volume between the wafer support and the table. The actual process unit (for example a nano-stamp) is situated on the top of the wafer transport tool. This may for example be a nano-stamp, which is placed in a microscopic distance above the previously created structures of the calibrated wafer. The stamp may for example be air-cushioned, that is flying on top of the wafer by the force of an air cushion, which may be created by small air injectors. Preferably, the process volume in which the processing is performed is evacuated to avoid enclosures of air on a surface of the substrate, when the surface is stamped.

The movement of the table in the process unit is computed by a control unit, which uses the position information generated in a measurement unit and the coordinates determined by probing the alignment marks on the wafer transport tool. Since topographic information of the single devices as well as the specific parameters (position of alignment marks) of the wafer transport tool have been processed during the alignment, it is possible for the process unit to precisely process the individual process areas of single devices, once the wafer transport tool has been uniquely identified by for example an identification tag. Adjusting single devices individually is thus no longer necessary during the actual processing. Furthermore, since wafer transport tools can be uniquely identified by ID-tags, one single measure-station may supply numerous process units. It is furthermore possible to combine measurement and processing into one single evacuated volume. On the other hand, it is a big advantage of the inventive concept, that the wafer transport tools may be stored in appropriate housings before being finally processed by a process unit.

Although the fixation of a substrate (wafer) on a substrate support has been previously described mainly by use of vacuum techniques, it is also possible to use any other temporal bonding technique to fix the substrate on the substrate support. This may for example be achieved by using wax, which glues together the substrate and the substrate support and which may be heated up for the removal of the substrate. Another technique known is using a foil that connects the substrate and the substrate support due to adhesive forces.

Furthermore, the geometrical shape of the substrate support is by no means restricted to be rectangular as in the above examples. It is going without saying that an inventive substrate support may have any other shape without limiting its functionality.

In the embodiments discussed in accordance with the preceding drawings, an alignment mark, which is either being placed on a substrate support or on the substrate itself is applied to the substrate or the substrate support in an orientation pointing to the surface of the substrate. It is of course possible to place the alignment mark at any other position that can be read-out by a high precision read-out such as an atomic force microscope. In particular, it may be advantageous to place the mark on the side of the substrate support that is opposite to the substrate itself, allowing for a laterally more compact implementation of the inventive concept. The alignment mark may also be placed on the backside of the substrate or the substrate support. It may be noted that it is also possible to apply the alignment mark on the surface of the substrate in the very first production step (for example by nano-imprinting) such that all following production steps align to those alignment marks.

Although an extremely high position accuracy can be achieved by use of atomic force microscopes, the use of an atomic force microscope is not mandatory to implement the inventive concept. Alternatively, any other read-out technique, for example capacitive coupling on a microscopic scale, may be used to precisely determine the position of the alignment marks.

While the foregoing has been particularly shown and described with reference to particular embodiments thereof, it will be understood by those skilled in the art that various other changes in the form and details may be made without departing from the spirit and scope thereof. It is to be understood that various changes may be made in adapting to different embodiments without departing from the broader concepts disclosed herein and comprehended by the claims that follow.

What is claimed is:

1. A method for manufacturing a device using a substrate having a surface, the method comprising:
   providing at least one alignment mark on one of the substrate or a substrate support to which the substrate is mounted;

determining a position of the at least one alignment mark being fixed with respect to the substrate, wherein the at least one alignment mark is not located in an area of the substrate which is processed during manufacturing using a nano-imprinting technique and wherein a coordinate system is defined when the position of the at least one alignment mark is determined in which to derive position information of at least first and second process areas;

determining position information for the position of the first process area on the surface of the substrate which is processed during manufacturing and for the position of the second process area on the surface of the substrate which is processed during manufacturing with respect to the at least one alignment mark, wherein determining the position information for the process areas with respect to the at least one alignment mark comprises identifying previously applied structures within the first and the second process areas by comparing topographic information obtained by scanning the respective process areas on the surface of the substrate with stored reference-topographic information, and storing the determined position information as stored position information and wherein, since the topographic information is scanned within the defined coordinate system, two two-dimensional vectors in the defined coordinate system pointing to two edges of the first process area are derived to provide the position information for the position of the first process area and stored;

redetermining the position of the at least one alignment mark within a process coordinate system for a manufacturing process, wherein relative orientation of the defined coordinate system with respect to the process coordinate system is characterized by at least one translation vector and at least one rotation angle;

aligning the position of the first process area within the manufacturing process using information derived from the redetermined position of the at least one alignment mark and from the stored position information for the position of the first process area by transforming the two stored position vectors into the process coordinate system utilizing the at least one translation vector and the at least one rotation angle;

processing the first process area using a nano-imprinting technique;

aligning the second process area using information derived from the stored position information for the position of the second process area; and processing the second process area using the nano-imprinting technique;

wherein the stored position information is transferred together with the substrate.

2. The method in accordance with claim 1, further comprising the steps of:
storing or transporting the substrate and the at least one alignment mark between the steps of determining the position of the at least one alignment mark and redetermining the position of the at least one alignment mark.

3. The method in accordance with claim 2, in which the step of determining the position of the at least one alignment mark and redetermining the position of the at least one alignment mark comprises a detection of mechanical structures within the at least one alignment mark by an atomic force microscope.

4. The method in accordance with claim 2, further comprising the step of:
providing the at least one alignment mark by fixing the substrate to a substrate support having applied thereon the at least one alignment mark.

5. The method in accordance with claim 4, in which the fixing is performed by application of a vacuum between the substrate and the substrate support.

6. The method in accordance with claim 4, in which the fixing of the substrate to the substrate support is making use of temporal wafer bonding techniques.

7. The method in accordance with claim 1, in which the step of determining the position of the at least one alignment mark comprises a detection of mechanical structures within the at least one alignment mark by an atomic force microscope.

8. The method in accordance with claim 7, further comprising the step of:
providing the at least one alignment mark by fixing the substrate to the substrate support having applied thereon the at least one alignment mark.

9. The method in accordance with claim 8, in which the fixing is performed by application of a vacuum between the substrate and the substrate support.

10. The method in accordance with claim 8, in which the fixing of the substrate to the substrate support is making use of temporal wafer bonding techniques.

11. The method in accordance with claim 1, further comprising the step of:
providing the at least one alignment mark by fixing the substrate to the substrate support having applied thereon the at least one alignment mark.

12. The method in accordance with claim 11, in which the fixing is performed by application of a vacuum between the substrate and the substrate support.

13. The method in accordance with claim 11, in which the fixing of the substrate to the substrate support is making use of temporal wafer bonding techniques.

14. The method in accordance with claim 11, wherein the substrate support comprises a memory device that holds calibration information for the substrate attached to a particular substrate support.

15. The method in accordance with claim 1, further comprising the step of:
generating the at least one alignment mark on the substrate, wherein the at least one alignment mark is not located in an area of the substrate which is processed during manufacturing using a nano-imprinting technique.

16. The method in accordance with claim 1, in which the step of determining the position information for the position of the second process area comprises:
determining relative position information for a relative position of the second process area with respect to the first process area; and
deriving the position information for the position of the second process area using the position information for the position of the first process area and the relative position information.

17. The method in accordance with claim 1, in which additional tag information of a computer-readable information tag associated to the substrate is stored in the step of storing the position information, to allow for the association of the stored position information to the substrate.

18. The method in accordance with claim 1, wherein transferring the stored position information together with the substrate enables a production process, wherein the alignment process is separated from the processing of the process areas.

19. The method in accordance with claim 1, wherein the stored position information is transferred anytime between determining the position of the at least one alignment mark and processing the process areas.

20. The method in accordance with claim 1, wherein storing the determined position information as stored position information comprises storing the alignment information in a memory associated to the substrate.

* * * * *